United States Patent [19]

Palanisamy

[11] Patent Number: 4,937,528
[45] Date of Patent: Jun. 26, 1990

[54] METHOD FOR MONITORING AUTOMOTIVE BATTERY STATUS

[75] Inventor: Thirumalai G. Palanisamy, Morristown, N.J.

[73] Assignee: Allied-Signal Inc., Morris Township, Morris County, N.J.

[21] Appl. No.: 257,913

[22] Filed: Oct. 14, 1988

[51] Int. Cl.$^5$ ............................................. G01N 27/46
[52] U.S. Cl. ..................................... 324/430; 320/48; 324/431; 324/433
[58] Field of Search ............... 324/503, 426, 427, 430, 324/431, 433; 320/48; 340/636

[56] References Cited

U.S. PATENT DOCUMENTS

| | | | |
|---|---|---|---|
| 3,971,980 | 7/1976 | Jungfer et al. | 324/427 |
| 4,433,294 | 2/1984 | Windebank | 324/426 |
| 4,719,427 | 1/1988 | Marshita et al. | 324/427 |
| 4,745,349 | 5/1988 | Palanisamy et al. | 320/48 |

FOREIGN PATENT DOCUMENTS

| | | | |
|---|---|---|---|
| 0273577 | 7/1988 | European Pat. Off. | 324/427 |
| 3321814 | 1/1985 | Fed. Rep. of Germany | 324/427 |
| 0240876 | 10/1987 | Japan | 324/427 |
| 1454358 | 11/1976 | United Kingdom | 324/427 |
| 8302005 | 6/1983 | World Int. Prop. O. | 324/427 |

Primary Examiner—Reinhard J. Eisenzopf
Assistant Examiner—Robert W. Mueller
Attorney, Agent, or Firm—Ernest D. Buff; Gerhard H. Fuchs; Richard C. Stewart

[57] ABSTRACT

A vehicle storage battery is monitored to determine battery capacity, state of charge and certain fault conditions. The ambient temperature, battery voltage alternator/regulator output voltage and current to and from the battery are continuously measured. Current voltage (I-V) data is analyzed to determine the internal resistance and polarization of the battery. A determination is made regarding state of charge and fault conditions produced by corroded terminals and low electrolyte level. The low temperature starting limit is determined by comparing the battery's power output capability with starting power requirements of the vehicle. Data produced by the comparison are indicated on the dashboard of the vehicle.

18 Claims, 8 Drawing Sheets

1. SLI Battery
2. Starter Motor Load
3. Accessory Load
4. Power Source (Alternator/Regulator)
5. Diode
6,7 Shunts
8-11 Actuators 525 CCA Battery
⊙ Limit IR
⊡ Actual IR

METHOD FOR MONITORING AUTOMOTIVE BATTERY STATUS

BACKGROUND OF THE INVENTION

1. Field of the Invention

This invention relates to a method and apparatus for automatically testing, monitoring and maintaining a motor vehicle starting system and more particularly to a system by which the condition of the vehicle storage battery, as well as the low temperature starting limit, maintenance requirements and service life thereof can be monitored.

2. Description of the Prior Art

Systems for determining one or two of such battery conditions as battery capacity, state of charge, defects in the battery and the charging system, maintenance requirements and timely indication of the need to replace the battery or alternator/regulator, have been developed to facilitate maintenance of a reliable and safe motor vehicle. Manual determination of these parameters is expensive, time consuming and often has to be conducted at service stations. With the introduction of microprocessors, the battery characteristics, engine starting requirements and operational characteristics of a vehicle can be determined automatically, providing optimum life and safety performance for vehicle components.

Automotive batteries provide power for the vehicle's starting, lighting and ignition (SLI) components of the car. Of these, the starter motor requires the most power and is the first component affected by a weakened SLI battery. The necessity for determining when the battery is on the verge of losing its ability to provide the required power is readily apparent. Such a determination is arrived at by a skilled mechanic during testing of the battery and the charging system at a garage, or by means of a monitoring device located in the vehicle. The latter is advantageous in that it is more convenient and provides timely and unbiased advice.

Generally, the automotive battery puts out a few hundred amperes of current for a few seconds of the starting period, the actual amperage being dependent on the battery capacity and its state of charge, and on design and size of the automotive engine and starter motor. The battery is then recharged by the charging system of the vehicle, which consists of an alternator, rectifier, regulator, voltage and current controllers, typically in several minutes.

Several conditions of component status can cause starting failure of a vehicle. These are: Low state of charge of the battery, loss of the battery capacity, corroded terminals, low level of the electrolyte defective charging system and defective starter motor. A battery status monitor should function to sort out these problems automatically. The monitor should diagnose a problem as it develops and warn the user in advance of imminent failure. However, battery monitors heretofore disclosed do not identify each of the aforementioned problems; most of them attempt to determine only the state of charge of the battery.

Battery monitors originally comprised merely an ammeter and/or a voltmeter located on the dashboard of the vehicle. They provided limited information of a type useful only to knowledgeable drivers. To have the battery tested, the car was garaged, the battery was disconnected from the vehicle's electrical system by a skilled mechanic and discharged through a known load. Alternatively, monitoring instruments were employed to derive the battery status parameters using an a.c. signal without discharging the battery through a load. Such monitoring instruments require that the battery be disconnected from the electrical circuitry of the car. Even then they provide information about the state of charge solely.

Conventionally, the state of charge of the battery has been determined by measuring specific gravity of the electrolyte. This method is predicated on the fact that the specific gravity of the sulfuric acid electrolyte decreases when the battery is discharged and increases when the battery is charged. Normally, the specific gravity of the battery electrolyte ranges from about 1.28-1.30 when the battery is fully charged. Such a method is laborious and cannot predict loss of battery capacity in advance. Furthermore, such problems as corroded terminals are not detected by this method.

An alternative method for determining the state of battery charge involves the continuous counting of charge into and out of the battery. This method is subject to accumulation of error due to the current consumed by gassing in the battery and changes in battery capacity arising from corrosion of the electrode plates and shedding of active material. A device of this type, using a current to frequency converter, is described in U.S. Pat. No. 4,678,999 to J. F. Schneider.

A battery's maximum power output is determined by its voltage and internal impedance. Generally the internal impedance of the battery increases with the life of the battery and with a decrease in its state of charge. In U.S. Pat. No. 4,678,998 to Muramatsu, there is described a device based on this principle. According to Muramatsu, the relationship between battery impedance, remaining capacity and remaining service life is predetermined at different frequencies and stored in memory. To determine the battery condition, a computer evaluates the internal impedance at a few frequencies and looks up to the stored table of predetermined values to obtain the remaining service life of the battery. Such a device is subject to the drawback that each battery or battery group has to be subjected to tests before installation to generate the table of predetermined values.

U.S. Pat. No. 4,665,370 to Holland describes a battery monitor wherein a cranking motor furnishes the load for the battery and an electronic apparatus automatically measures the condition of the battery each time the engine is started. The battery monitor compares the unloaded battery voltage with the voltage under load and indicates that the battery is bad if the voltage differential exceeds a predetermined limit. One disadvantage of this device is the inability thereof to distinguish between a low state of battery charge, a fully charged battery having low capacity and additional faulty conditions of the battery such as corroded terminals or low electrolyte level.

SUMMARY OF THE INVENTION

The present invention provides a method and apparatus for monitoring a vehicle storage battery to determine certain conditions, including defects and characteristics, of the battery. Generally stated, the apparatus comprises a microprocessor means located on the vehicle for controlling the operations of the apparatus. A software means instructs the microprocessor means to control the sequence of the operations. Memory means are connected to the microprocessor means for storing the software instructions and predetermined relationships between the internal resistance of said battery, the tolerable limit of the internal resistance and the ambient temperature of the battery.

A digital to analog converter means is connected to the microprocessor means for converting digital signals from the microprocessor means to analog signals. The digital to analog converter means has connected thereto a direct current power generator means for producing electric power at voltage and current required by the microprocessor means. A current sensor means, connected to a terminal of the battery measures the current passing into and out of the battery. The ambient temperatures of the battery is measured by a temperature sensor means, located in close proximity thereto. A voltmeter means measures the voltages of the battery, current sensor, temperature sensor and direct current power generator means. Connected to the voltmeter is an analog to digital converter means for converting the analog signals from the voltage measurements to digital signals appointed for transfer to the microprocessor. A second software means analyzes the current, voltages, temperature and determines the internal resistance and polarization of the battery, defects in said battery and low temperature starting limit to establish the battery maintenance and replacement requirements. The apparatus has an actuator means for controlling the electrical circuits connecting the sensors, the direct current power generating means and the battery. A display means, controlled by the microprocessor, indicates said battery status and advice.

In addition, the invention provides a method for monitoring a vehicle storage battery, which comprises the steps of:

(a) measuring continuously the ambient temperature, the battery voltage, the alternator/regulator output voltage, and the current to and from the battery;

(b) analyzing the current-voltage (I-V) data to determine the internal resistance and polarization of the battery;

(c) determining the state of charge, and fault conditions produced by corroded terminals, and low electrolyte level;

(d) determining the low temperature starting limit by comparing the battery's power output capability with starting power requirements of said vehicle; and (e) indicating data produced by such comparison.

An alternative method, provided by the invention, involves determining the battery capacity by measuring the charge input to the battery and the corresponding increase in the battery voltage.

Yet another method provided by this invention for monitoring the condition of and providing status and advice concerning the vehicle storage batery comprises the steps of:

(a) subjecting the battery to a special test cycle wherein a predetermined profile of current or voltage is imposed onto the battery by the charging system and the battery response voltage or current is measured;

(b) evaluating the data in the forms, dV/dI versus I, or dI/dV versus V:

(c) determining the battery characteristics, including the capacity, and the voltage (d) determining the battery defects, including mismatched cell, soft-shorted cell, and loss of capacity; and (e) indicating the data and advice.

A battery status monitor made using the method and apparatus of this invention can determine the present battery capacity, state of charge and fault conditions. When the battery is in a predetermined range of its state of charge near its fully charged status, the monitor can cut out the alternator through a clutch, thereby enhancing the gas mileage. When the state of charge is below a set limit, or the accessory current drain is above a preset limit, or the ambient temperature is below a preset limit, the power source is kept operational.

An important feature of this invention is its capability to indicate the low temperature starting limit of the car together with the battery's present conditions. The monitor arrives at a number for the low temperature limit by taking into account both the engine starter motor requirements and the battery's ability to meet them.

An important advantage of this invention is that the monitor can offer unbiased advice to the user concerning the decision whether to maintain or to replace the battery This monitor, by evaluating the values of the internal resistance and the polarization, is capable of indicating whether the terminals need cleaning or the battery needs water. Upon detecting conditions such as the presence of (i) one or more bad cells (low capacity mismatched cells or soft-shorted cells), or (ii) high internal resistance in the absence of any other defects, the monitor indicates the need to change the battery.

BRIEF DESCRIPTION OF THE DRAWINGS

The invention will be more fully understood and further advantages will become apparent when reference is made to the following detailed description of the preferred embodiments of the invention and the accompanying drawings, in which.

DESCRIPTION OF THE PREFERRED EMBODIMENT

Figure 1:
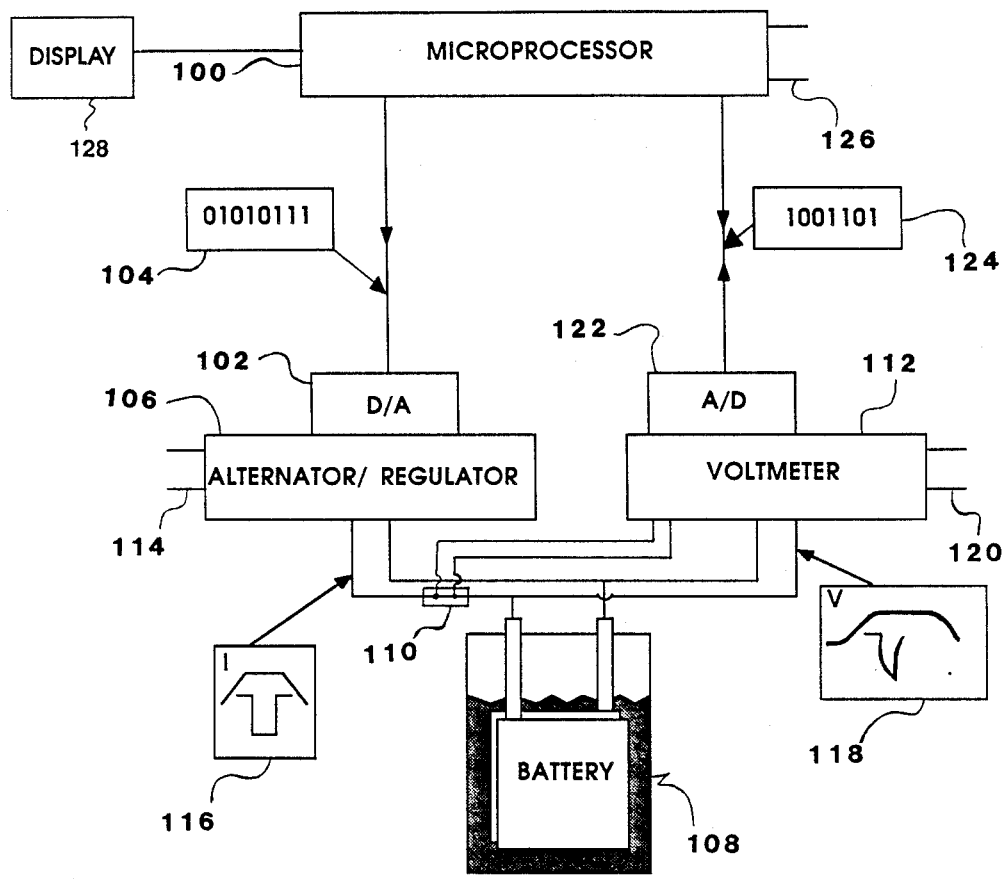
FIG. 1 is a block diagram showing the battery status monitoring apparatus of the invention in conjunction with other components of a motor vehicle starting system.
Figure 3:
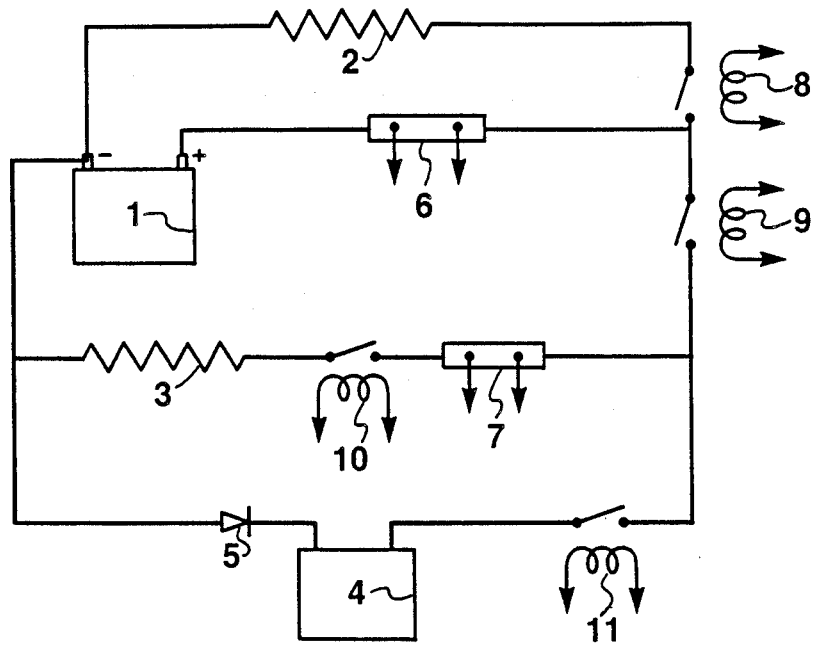
FIG. 3 is a schematic circuit diagram for testing the battery status monitor.

Referring to the drawings, there is illustrated in FIG. 1 a block diagram of the battery status monitor of this invention in conjunction with some of the other components of the motor vehicle starting system. A microprocessor 100, located on the vehicle for controlling the operations of the apparatus, has ROM and RAM memory for storing software, which instructs the microprocessor on the sequence of operations. The memory also stores the predetermined relationships and data concerning the battery and the vehicle's starting system. The microprocessor is also connected to a digital to analog converter 102, which converts the digital signals 104 to analog signal and transmits the analog signal to the alternator/regulator 106. The alternator/regulator is connected to the battery 108 through a current sensing shunt 110 and to a voltmeter 112. The alternator/regulator is also connected to other components of the vehicle through the leads 114. A programmed current 116 or voltage is provided to the battery by the alternator/regulator. The battery's response voltage 118 or current is measured by the voltmeter which is also connected to other components of the vehicle, including the temperature sensor, through the leads 120. An analog to digital converter 122 attached to the voltameter converts the analog measurements to digital signal 124 and transmits the digital signal 124 to the microprocessor which is also connected to other components of the vehicle through the leads 126. The accessories and the starter motor, connected in parallel with the battery and the alternator/regulator, are shown in FIG. 3.

Figure 2:
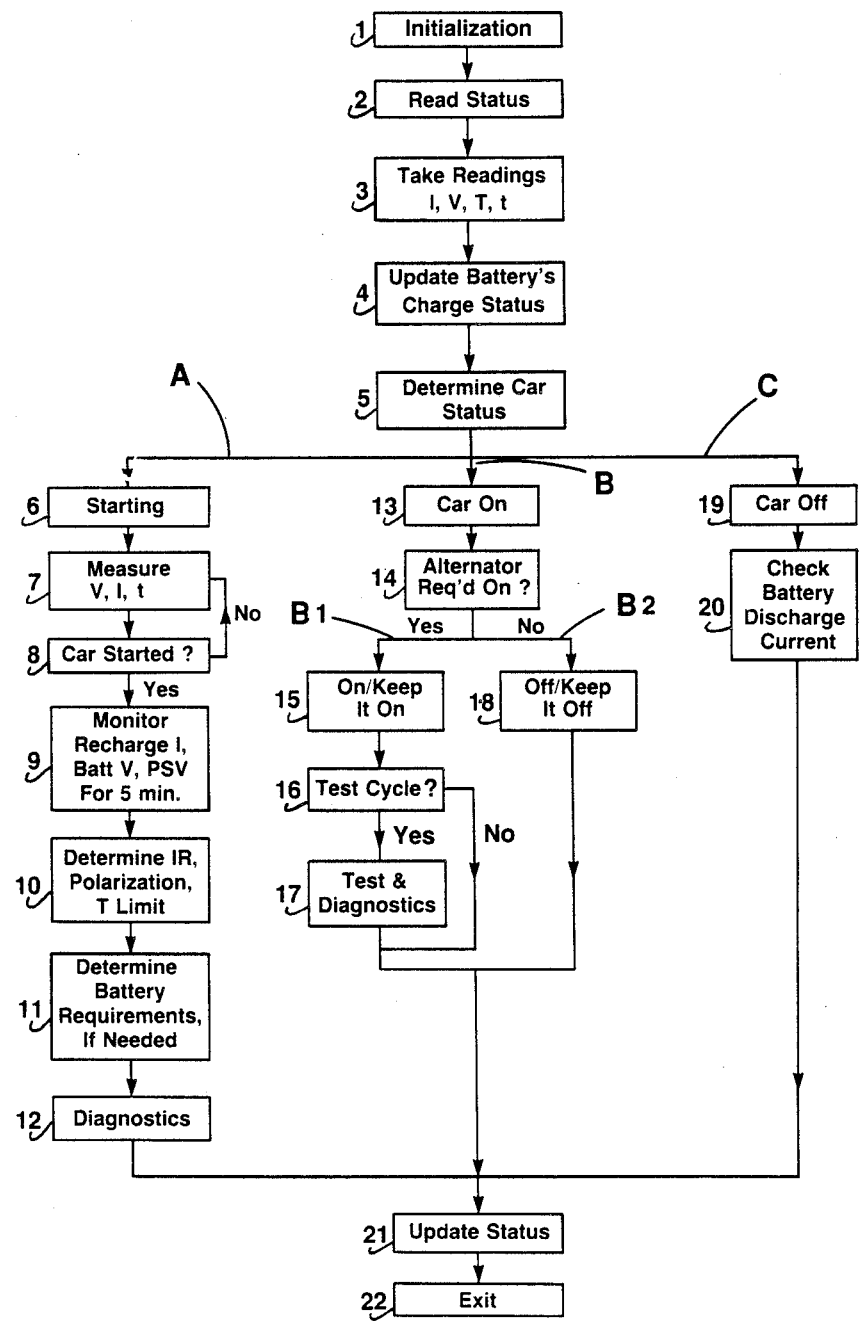
FIG. 2 is a flow diagram of a preferred embodiment of this invention.

The flow diagram illustrated in FIG. 2 shows the sequential operations of the battery status monitor. As illustrated, the flow diagram applies to the test apparatus and the test circuit, of FIG. 3, and is controlled by a multiuser microcomputer. For the commercial device to be installed in the automotive vehicles, steps 2, 21 and 22 may be eliminated without affecting the operations of the battery monitor; the microprocessor will execute step 3 instead of step 21, thus forming a continuous loop for the sequence of operations.

In step 1, all the variables are initialized. This step is executed only one time, when the device is installed in the car. The monitor then reads the values of all variables typically representing the characteristics of the car and the battery in step 2; this step is equivalent to step 21. It will be understood by those practicing the art that step 2 is not necessary in the commercial device since it will have a dedicated microprocessor with a continuous loop for the sequence of operations. In step 3, the monitor measures the ambient temperature (T), battery voltage (V), the power source voltage (Vs), current (I) using the shunt or other current sensing device, and real time (t). The power source in the test circuit, illustrated in FIG. 3, is a power supply with voltage and current ratings equal to the output voltage and current of an automotive alternator/regulator. Hereafter, the combination of alternator, rectifier, voltage and current controllers will be referred to as the power source.

In step 4, the battery's state of charge is updated using a combination of the charge integration technique and the open circuit voltage (OCV). The first method based on OCV to determine state of charge (SOC) makes use of the fact that the open circuit voltage of a fully charged lead acid cell exhibits 0.2 V higher than the OCV of a completely discharged cell. The cell voltage varies linearly in between these extremes. The voltage of a battery when no current is flowing into or out of the battery is normally referred to as the open circuit voltage. Since the automotive battery normally has six cells and a fully charged battery has 12.7 V or higher, the state of charge can be calculated as follows:

$$SOC = 100 - (((12.7 - OCV)/1.2)*100) \% \quad (1)$$

The cell voltage used in this calculation should be free from polarization. The polarization normally arises from nonuniformity of the electrolyte concentration at or near the electrodes compared with the electrolyte concentration in the bulk. The voltage measured until several minutes after a charge or discharge invariably includes significant polarization voltage, even though there is no substantial current flowing from or to the battery.

The second method involves integration of the current that goes into and out of the battery at all times. The monitor starts counting the charge from a predetermined charged state of the battery. The total charge put into the battery from the power source is added to the stored charge of the battery, which is really the battery capacity to start with. Similarly the charge taken out of the battery during starting and by the accessories is subtracted from the stored charge. This net charge divided by the battery capacity gives the state of charge of the battery. Any time the monitor detects that the battery is fully charged, it resets the state of charge to 100%. The fully charged state of the battery is recognized when the open circuit voltage of the battery is above a predetermined value, preferably 12.7 V. The fully charged status of the battery is also recognized through the test cycle of the battery. The state of charge determined only by the charge integration method will have error due to gassing in the battery and change in battery capacity arising from corrosion of the electrode plates and shedding of active material. Therefore, the monitor uses this charge integration method from the instant of the starting of the car until a preset limit of time, preferably two hours, elapses from the time the engine is switched off. As the skilled practioner in the art will appreciate, the combination of the two methods described above offers accurate value of the state of charge of the automotive battery.

In step 5 the vehicle status is determined. If the vehicle is in the starting process, the monitor follows the path beginning with step 6 in branch A. Otherwise, branch B beginning with step 13 is followed when the engine is running and route C with step 19 is followed when the engine is off.

In route A, the monitor measures the parameters V, I and t repeatedly in steps 7 and 8 until the vehicle engine has started or the driver has stopped the cranking process. The monitor can recognize the status of the starting process from the sign and value of the current I. Practioners of the art recognize that the starting process can be identified in several other ways as for example from the starting switch. If the vehicle engine has started, the monitor continues at step 9; otherwise control is transferred to step 3 again. In step 9, the monitor measures the recharge current, battery voltage and the power source voltage for a predetermined period of time, preferably 5-10 minutes. If the vehicle engine is switched off in the meantime, the monitor will go to step 3. In step 10, using the measurements during the starting process, the monitor determines the internal resistance (IR) and polarization ($P_R$).

Figure 4:
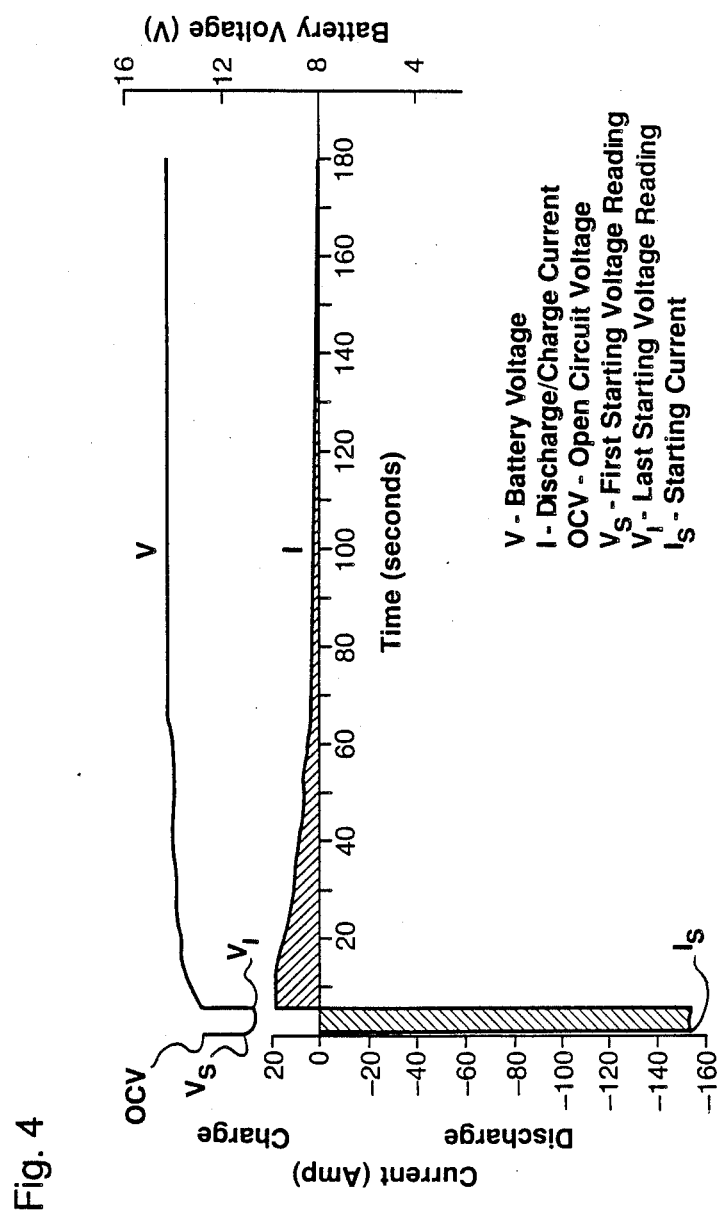
FIG. 4 is a graph depicting current voltage characteristics of an automotive battery during a sudden discharge and immediate recharge occassional by starting of a motor vehicle.

In accordance with this invention, the internal resistance of a SLI battery can be determined from the instantaneous change in voltage at the beginning and at the end of a current input to or output from the battery. The skilled practioner in the art will appreciate that there are numerous ways of achieving this, as for example, using any of the accessories for a discharge pulse current or the power source of the car for a charge pulse current. According to the preferred embodiment of this invention, the internal resistance of the automotive battery is determined from its open circuit voltage (OCV), the first measured voltage ($V_s$) and the initial current ($I_s$) that flows from the battery to the starter load during the starting process as illustrated in FIG. 4, and according to the equation 2:

$$IR = (OCV - V_s)/I_s \quad (2)$$

The maximum instantaneous power the automotive battery can output is inversely related to its internal resistance. Thus according to this invention, the battery's power output capability is determined from the internal resistance.

The battery polarization resistance ($P_R$) arises from nonuniformity in electrolyte concentration in the electrode to the bulk of the electrolyte between the plates. It is determined from the above parameters, $V_s$ and $I_s$ and the battery voltage after a predetermined time interval or the last voltage reading ($V_1$) during the starting process according to the equation:

$$P_R = (V_s - V_1)/I_s \quad (3)$$

It is appreciated that the internal resistance and polarization can be determined as frequently as desired making use of the starting or switching off of the car engine or switching on or off of any accessory in the automobile.

Figure 5:
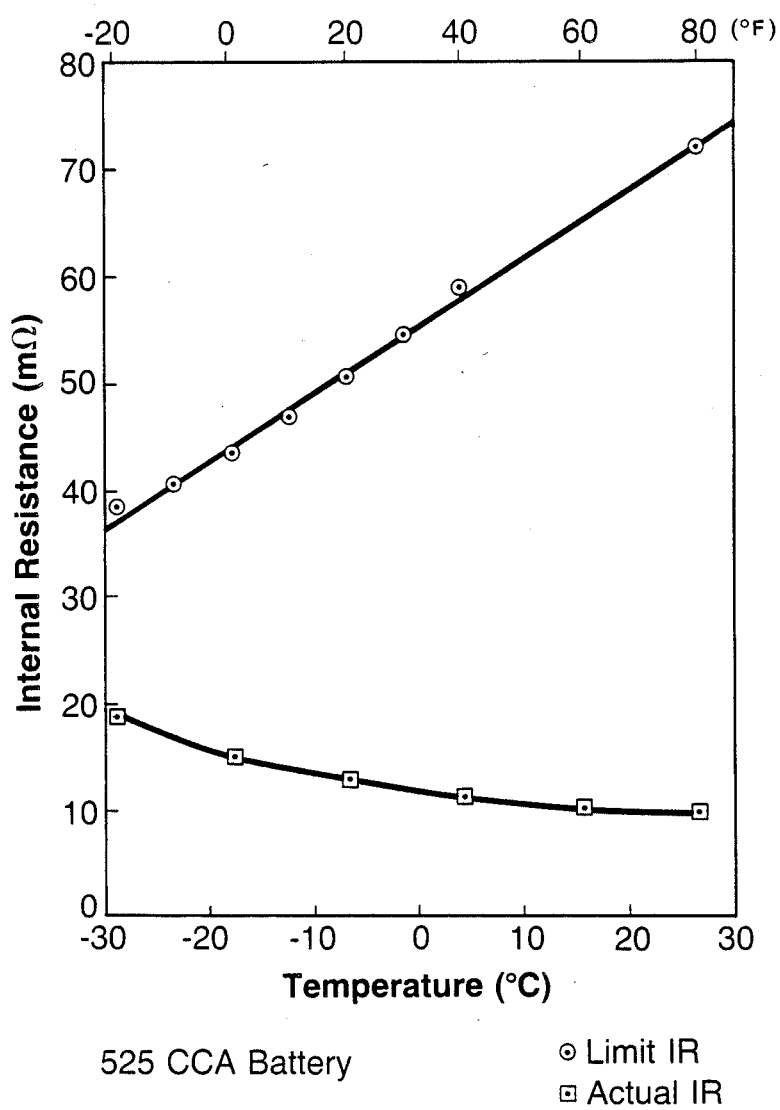
FIG. 5 is a graph depicting the battery internal resistance and the maximum allowable limit of internal resistance as a function of temperature for a 525 CCA battery.

One of the important aspects of the preferred embodiment of this invention is its ability to predict the low temperature limit up to which the battery would be able to start the car. The temperature dependence of the starting power requirements of an automobile and the temperature dependence of the power output capability of the corresponding recommended size battery are illustrated in FIG. 5 in terms of the battery's internal resistance (IR). The IR is inversely proportional to the battery's maximum output power. It is clear from FIG. 5 that the battery can easily meet the required starting power at high temperature region of the normal usage temperature range. As the ambient temperature decreases, as for example in winter season, the battery's output power decreases and the car's required starting power increases. According to this invention, the car cannot be started below the temperature where these two curves cross.

Figure 6:
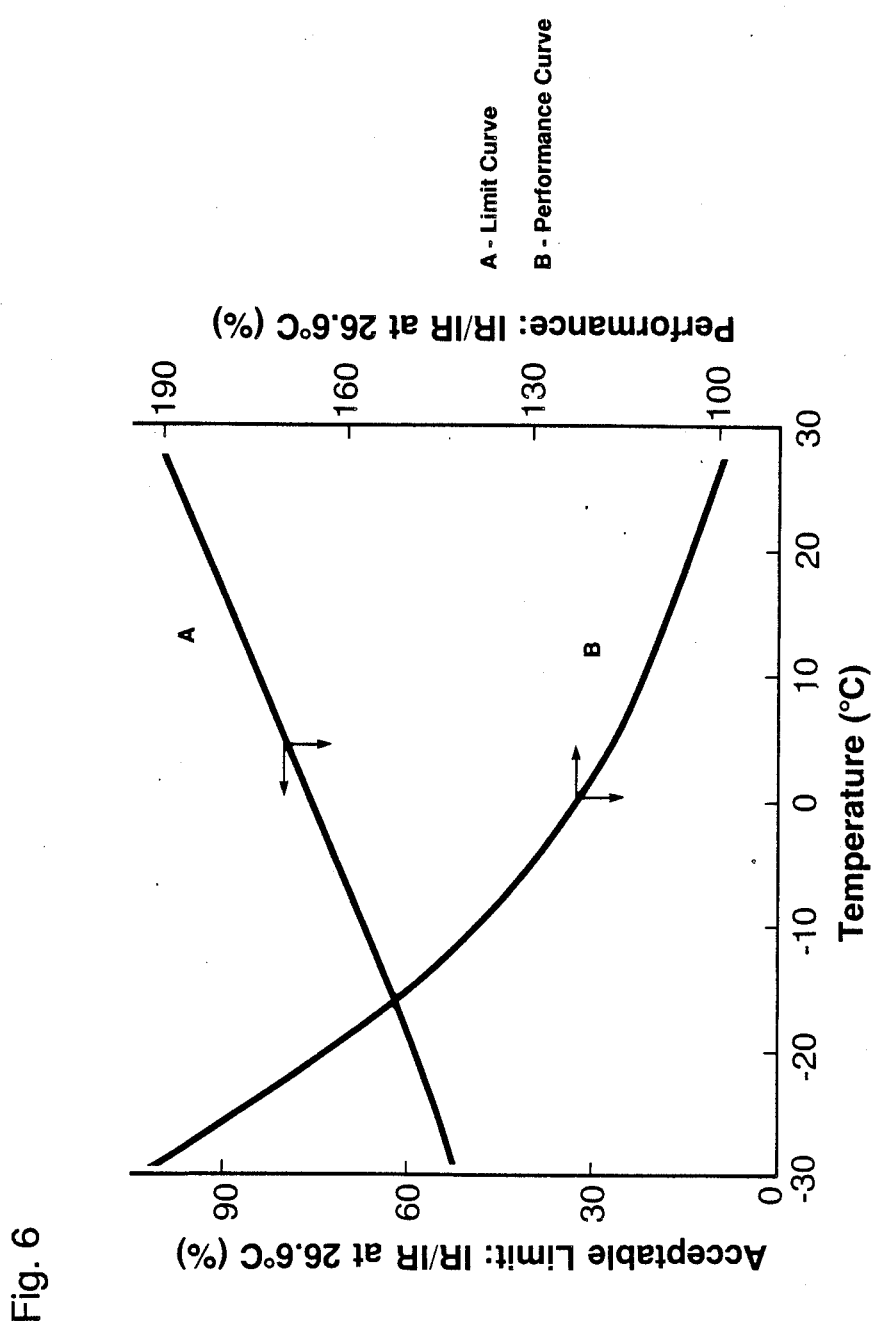
FIG. 6 is a graph showing the temperature dependence of battery requirements and battery performance relative to their respective values at room temperature (26.6°)

In accordance with the findings of this invention, the dependence of power requirements of various cars and the corresponding recommended battery's power output may be generalized and described as in the curves illustrated in FIG. 6. At temperatures around −30° C., the power output capability of the battery is only half of that at 27° C., whereas the power required to start the car at this low temperature is two times the power required at 27° C.

Next in step 10, the monitor then calculates the internal resistance of the battery at other temperatures using the IR determined in step 10, the temperature measured in step 3 and the relationship in curve B of FIG. 6. Similarly, the acceptable limits of IR at various temperatures are calculated using the data in curve A of FIG. 6, if the acceptable IR limit is known at any one temperature. This acceptable IR limit is calculated from the power requirements of the starting motor load which, in turn depends on the size and model of the engine. These power data can be obtained from the automobile manufacturer for one or more temperatures. Alternately, the monitor can determine these data in step 11 from its experience during the first week of its operation. For example, the monitor can measure the ambient temperature (step 3) and the current delivered by the battery during the starting process for the first few preset number of startings, and determine the acceptable IR limit in each case at a particular preset temperature, as for example 27° C., using the curve A in FIG. 6. The monitor then takes the average of these values as the engine starting requirement at that preset temperature. Using these two sets of data in relative terms, e.g., in percentage, curves A and B, illustrated in FIG. 6, the monitor calculates the absolute data such as in FIG. 5. The monitor then determines the temperature at which the two curves in FIG. 5 cross. This represents the temperature at which the battery's power output capability matches the power requirements of the starting motor.

All automotive batteries are rated in what is known as Cold Cranking Amperes (CCA) in the trade. In accordance with this invention, the battery's room temperature acceptable internal resistance limit (in milliohms), e.g., 27° C., multiplied by the rated CCA (in amperes) seems to be constant, around 37,800. This is true for all vehicles which use a 6 cell 12 volt lead acid battery system. Therefore the limit IR is obtained as follows:

$$\text{limit } IR = (37,800/CCA) \quad (4)$$

Practioners of the art appreciate that this constancy number would be different for different temperatures and any particular temperature can be used.

Next in step 12, various diagnostics are performed using the data collected during starting and recharging the battery right after starting. Those include maintenance requirements, as for example, cleaning terminals and adding water. A preferred version of the monitor recognizes maintenance needs as they arise and advises the driver accordingly. Soon after a battery, such as lead acid battery, is discharged or charged, the voltage measured across the battery terminals changes even though the battery is in open circuit, due to the nonuniformity of the electrolyte concentration in the pores of the electrodes and the bulk, normally known as concentration polarization. According to this invention, as the electrolyte level decreases, the polarization as defined in equation 3 increases. However, the polarization is also large when the state of charge is low though the electrolyte level is adequate. The monitor distinguishes between these two conditions by examining the state of charge determined earlier in step 4.

With the extensive use of maintenance free batteries in recent times, cleaning corroded terminals has become the most common maintenance problem for the automotive battery. As the battery terminals corrode with time, the resulting lead compounds (oxide and sulfate) on the terminals cause a substantial increase in resistance at the terminal to wire connection. The high resistance leads to a large voltage drop reducing the power available for the starter motor. This often results in inability to start the car. The preferred version of this invention can detect this problem as it arises and warn the user in advance. The positive and negative battery voltage sensing wires are fused with the battery's positive and negative lead wires respectively near the end of the wires connecting to the battery terminals. Therefore, the internal resistance determined by the monitor includes all resistance from positive lead wire end to negative lead wire end including the contact resistance between the wires and the battery terminals. The battery internal resistance remains within a narrow range as long as the state of charge is above 70% and the battery has not lost capacity substantially. A preferred embodiment of this monitor advises the driver to clean the terminals when the determined internal resistance is larger than a predetermined value, as for example, more than twice the initial internal resistance of the battery at a preset temperature.

A primary objective of this invention is to advise the driver of the necessity to change the battery before it becomes weakened to an extent that it cannot deliver the required power. All batteries, as for example the automotive lead acid batteries, lose capacity with age due to shedding of the active material and, irreversible change and unrechargeability of part of the active material. This is reflected in its internal resistance which correspondingly increases with age. A preferred embodiment of this invention, when it identifies larger than a preset limit of internal resistance of the battery, lower than a preset percentage of original capacity and a state of charge higher than 80%, advises the user to change the battery. The monitor also advises to change the battery when it detects a soft shorted cell or mismatched capacity cell. The procedure how it detects these situations will become clear in later steps.

After step 12, the control is transferred sequentially to step 21 wherein all parameters and variable values are stored in memory, steps 22, 1, 2 and 3. In commercial device, the control will be transferred to step 3 from step 12 due to the continuous operational loop. After passing through steps 4 and 5, when the engine is on and running, route B is followed.

A preferred embodiment of this invention can also save energy by providing a control output to trigger the alternator on/off depending upon the battery status and vehicle operating conditions. Typically the battery is maintained between a preset low limit, as for example 80%, and 100% state of charge (SOC). The alternator may be disconnected or disengaged from the drive through a clutch, or the field current cut-off whenever the battery reaches 100% SOC. Until the SOC falls to the preset low limit, e.g., 80%, the battery will meet all the power needs of the car. At the low limit of SOC, the alternator will be made operational again until the battery is fully charged, i.e., $SOC = 100\%$. However, when the power requirement in the car exceeds a certain preset limit, or the ambient temperature is below a preset limit, the alternator will be left in operational on position even if the SOC is above the preset limit. This situation may arise when the car is driven in night time or winter season and also when the air conditioner is on. Similarly, the alternator will be operational each time the car is started until the battery is fully charged. Typically this may take five to ten minutes after the start of the car. Control of the alternator is expected to lead to a long life for the battery since the continuous severe charging conditions and gassing experienced by the battery during overcharge are virtually eliminated.

Next in step 14, the monitor checks whether the alternator is required to be on according to the criteria discussed in the previous paragraph. If it should be on, the route B-1 starting with step 15 is followed; otherwise, the route B-2 with step 18 is followed. In step 15, the alternator is switched on or kept on if it is already on. In step 16, the monitor determines whether the driver has indicated the need for a test cycle. In the next step (17), a special battery test cycle is performed if the driver desires. The car engine should be on continuously and should remain at or above a minimum speed in revolutions per minute (RPM) so as to obtain a preset minimum output power from the power source, i.e., alternator/regulator at least for a few minutes in order to be able to complete the test cycle successfully. Typically this would be done in rural driving or highway driving unless the output power from the power source is high enough even during engine idle speed. Otherwise, the test cycle would be aborted. In a preferred version of this invention, the driver would press a button or other means to indicate the desirability of this test. The monitor then charges the battery to 100% SOC, isolates the battery for a preset period and performs the test.

Figure 7:
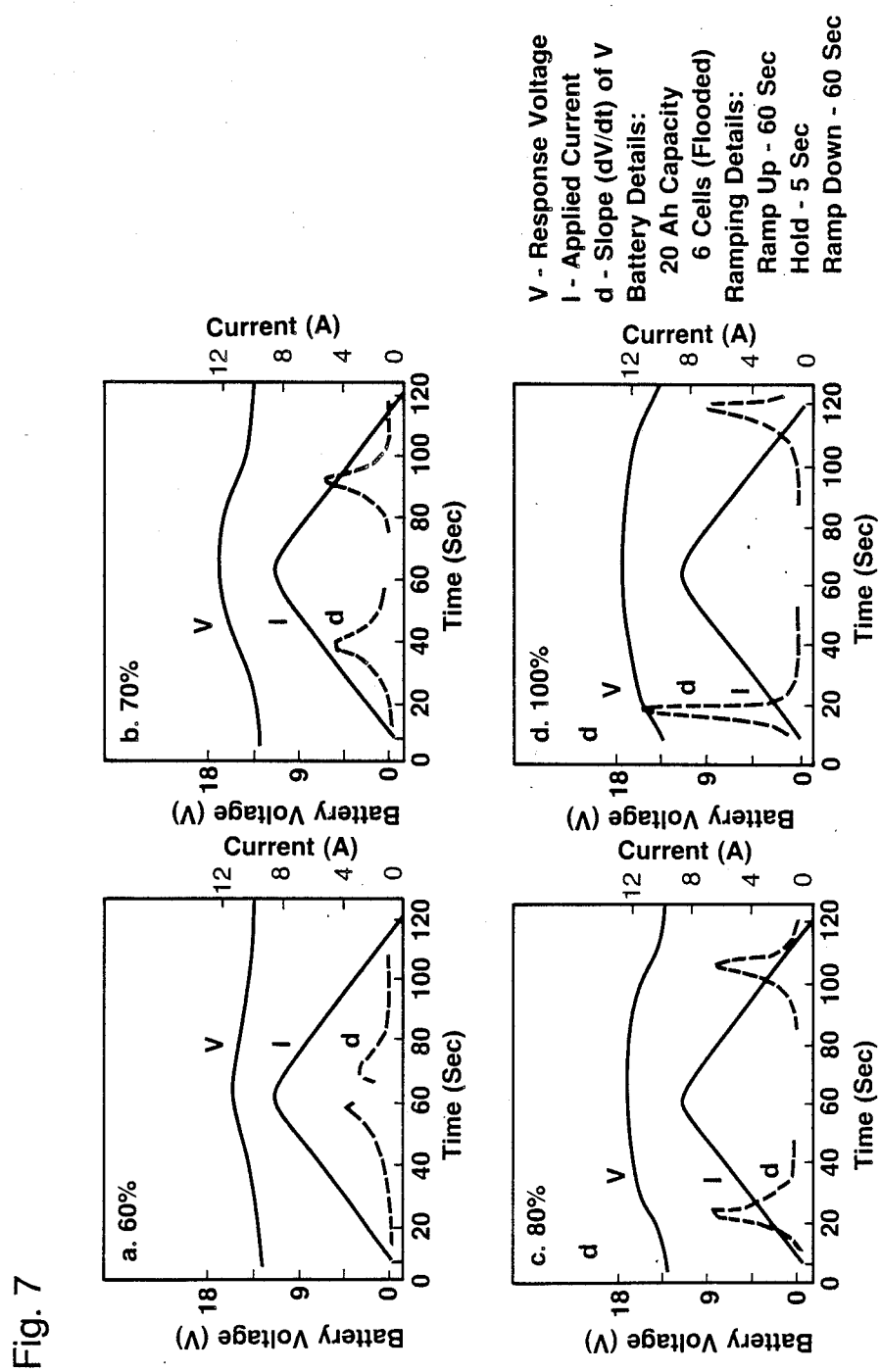
FIG. 7 is a block diagram showing the method for detection of gas point by current ramping technique.

In a preferred embodiment of the invention, the test cycle involves imposing a linearly increasing current or voltage ramp onto the battery terminals and measuring the corresponding voltage or current response of the battery as illustrated in FIG. 7. Typically, the current signal consists of an increasing ramp from 0 A to a preset limit in a preset time interval, holding constant at this value for a preset interval, and a decreasing ramp from this preset level to 0 A in the same preset time interval. For example the current may be increased from 0 to 20 A in 60 seconds, held at this level for 5 seconds, and decreased from 20 to 0 A in 60 seconds. It is obvious to those in the art that the current output of the power source will be continuously adjusted by the monitor such that the required current for the battery test is available at any instant during the test. When the voltage ramping is used, the signal consists of an increasing ramp from the open circuit voltage (OCV) to an end voltage which is higher than the OCV by a preset limit, as for example, 3 V higher than the OCV, in a preset time interval, and decreased from this level to the OCV in the same preset time interval. In both current ramping and voltage ramping methods, the increasing signal reverts over to the holding portion before the preset time limit is exceeded, whenever a preset voltage limit, e.g., 2.6 V/cell, is reached. The presence of a maximum in dV/dI versus $I_{ramp}$, or a minimum in dI/dV versus $V_{ramp}$ indicates the gas point. From the voltage at the gas point, the number of cells (NOC) is calculated using the following formula:

$$NOC = V_{gas}/2.5 \qquad (5)$$

Figure 8:
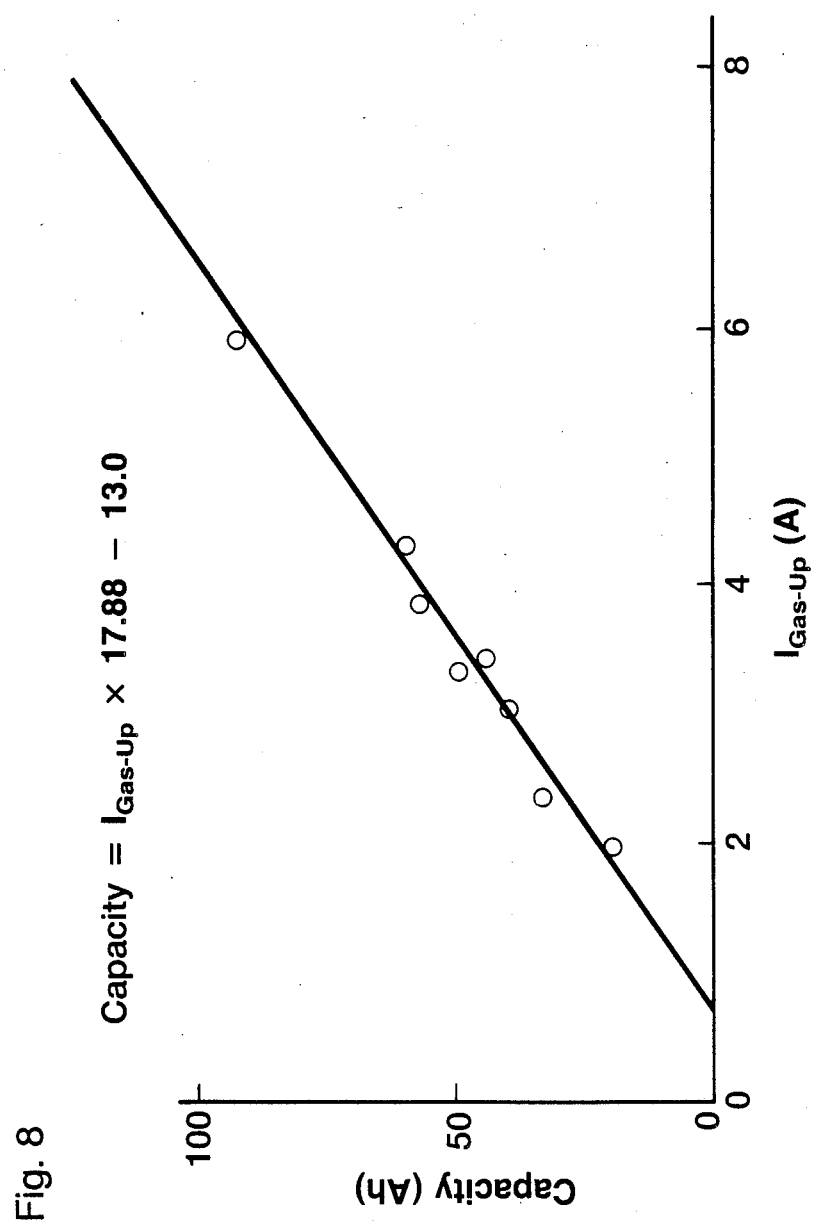
FIG. 8 is a graph depicting battery capacity versus the current at which the battery starts evolving gas.

In an automotive battery this would normally be 6. Any other number is indicative of a defective battery. The current at which the gas point occurs in the ramp up direction, $I_{gas-up}$ is proportional to the battery capacity as illustrated in FIG. 8. The current at which the gas point occurs in the ramp-down direction, $I_{gas-down}$, reaches the lowest possible value, typically around 0.8 A, when the battery is fully charged. Thus, the state of charge can be determined from the $I_{gas-down}$ parameters.

Batteries with mismatched cells give rise to two or more gas points in the ramp up and ramp down directions. Soft-shorted cells exhibit an inflection in dV/dI at very early stages of the ramp. The presence of sulfated cells give rise to an inflection in the ramp-up direction, but no corresponding inflection in the ramp-down direction. The battery status monitor can, thus, determine several battery defects which are often missed by even skilled mechanics.

Sometimes there are early indications of an imminent battery failure. Near the end of its useful life, some cells, especially the end ones, in the battery start losing capacity at different rates. This results in multiple gas points as indicated by the presence of plurality of inflections in dV/dI in both ramp-up and ramp-down during the test cycle, indicating the presence of mismatched cells. When the monitor detects mismatched cells with their capacities differing by more than a preset limit or the capacity of the weakest cell is lower than the preset limit, or if it detects the existence of a soft short in the automotive battery, the monitor warns the use of the necessity to change the battery.

In route B-2 step 18, the monitor switches off or disengages the alternator or keeps it off if it is already off. After step 18 in route B-2 and also after step 17 in route B-1, the control is passed to step 3 in a similar way to the transfer of control to step 3 after step 12 in route A. When the monitor detects the car engine off in step 5, it follows route C. In this route in step 20, it checks the discharge current from the battery. If the battery output current is more than a preset limit, as for example when the cabin light or head light or hood light is on, the monitor warns the user of the excessive leakage current. If the battery drain current is more than a preset limit and the accessories are all of, the monitor warns of the existence of short circuit in the electrical circuitry of the automobile. The monitor also indicates the existence of a soft short in one of the cells of the battery on detecting an open circuit voltage of the battery lower than a preset limit, when the car engine is off and there is no excessive current drain through the accessories. The monitor, then, suggests immediate replacement of the battery.

FIG. 3 is a basic block diagram of an apparatus capable of carrying out the method of this invention. It will be understood by those skilled in the art that the actual electrical circuitry of the automobile is more complicated than the circuit shown in FIG. 8 incorporating additional accessories and sensors and may be leaving out some of the actuators and shunts; nevertheless the automotive circuit can be reduced to this form. The battery (1), current sensing shunt (6), a microprocessor controlled starter switch (8) and a resister representing starter motor load (2) makes up the starting circuit. A resister forming the accessory load (3) represents the accessories, such as lighting, ignition, air conditioner and other appliances in the car. This load, in series with a microprocessor controlled switch (10) and a current sensing shunt (7), could be powered by either the battery through the switch (9) or by the power source (4), i.e., alternator/regulator, through another microprocessor controlled switch (11). The output voltage of the power source and the battery's state of charge determine which one of them provides power at a given time. The diode 5 prevents the battery from discharging into the power source when it is off. Whenever the battery is to undergo a test cycle, it is isolated from the rest of the electrical circuit using switches 8 and 9 for a few minutes before the test. The power source provides all the power for accessories in this time interval. During the test, switches 9, 10 and 11 remain closed. It will be appreciated that more elements can be added to the circuit to measure additional parameters as, for example, another shunt between the elements 4 and 11 or between the elements 2 and 8. Similarly, additional switches and accessories can be incorporated.

EXAMPLE 1 Determination Of The Internal Resistance And Polarization Of An Automotive Battery An automotive battery of 650 cold cranking amperes (CCA) was placed in a Tenney environmental chamber and subjected to a large pulse current discharge at 25° C. through a copper coil load which is equivalent to a starting motor load of an automobile for which this battery is recommended. The battery status monitor determined the internal resistance (IR), and polarization of the battery at 25° C. to be 7.4 and 1.6 miliohms respectively. A similar experiment with the battery at 0° C. showed the IR to be 9 mohms.

EXAMPLE 2 Determination Of Limit IR

The monitor determined an acceptable upper limit for the internal resistance (limit IR) of the above battery in Example 1 using its cold cranking amperes (CCA) rating using the equation 4. This value was 58 ohms at 25° C.

EXAMPLE 3 Determination Of Low Temperature Limit

The monitor extrapolated the battery limit IR value and the actual internal resistance of the battery, used in Examples 1 and 2, at 25° C. to low temperatures and determined the low temperature limit for startability of the car. This value was −38.7° C. A similar experiment with the battery at 0° C. showed a reliable temperature limit of −38.3° C. This indicates that whatever is the ambient temperature, the low temperature limit can be determined accurately.

EXAMPLE 4 Testing Batteries Of Different Size

Tests, as in Examples 1, 2 and 3 with batteries rated 630, 525, 475, 400 and 430 CCA, at 0 and 25° C. determined the reliable low temperature limit and the internal resistances as shown in Table 1.

TABLE 1

| Automotive Battery Testing With The Monitor | | | | |
|---|---|---|---|---|
| CCA (A) | Ambient Temperature (°C.) | Limit IR (mOhms) | Measured IR (mOhms) | Reliable Temp Limit (°C.) |
| 650 | 25 | 58 | 7.4 | −38.7 |
|  | 0 |  | 9.0 | −38.3 |
| 630 | 25 | 60 | 8.1 | −37.3 |
|  | 0 |  | 10.0 | −35.9 |
| 525 | 25 | 72 | 11.4 | −32.5 |
|  | 0 |  | 13.7 | −32.7 |
| 475 | 25 | 80 | 8.6 | −42.6 |
|  | 0 |  | 10.1 | −42.6 |
| 400 | 25 | 95 | 10.7 | −41.3 |
|  | 0 |  | 12.7 | −41.4 |
| 340 | 25 | 111 | 13.1 | −44.3 |

EXAMPLE 5 Determination Of The State Of Charge

The state of charge (SOC) of the battery in example 1 was determined by the monitor at different known levels of SOC. The battery was discharged for known intervals at a predetermined current. The net charge that went into or out of the battery was measured and added to or subtracted from the predetermined battery capacity respectively. From this value, the SOC of the battery was calculated which compared well with the value determined by the monitor.

An automotive battery was almost completely discharged and left for a day without re-charge. It was then connected to the monitor. The monitor detected the battery's very low state of charge and indicated the need for a full charge. It also displayed that the battery was sulfated.

In tests with another partially discharged battery (SOC<40%), the reliable temperature limit was shown to be higher than 35° C. The ambient temperature of the battery during this test was only 20° C. which meant the car could not be started without charging. Indeed, the power output of the battery was lower than the power required by the load at 20° C.

EXAMPLE 6 Evaluation Of The Battery Capacity

The capacity of the battery in example 1 was determined through a test cycle by the monitor. The battery capacity determined by the monitor compared well with the battery manufacturer's data. The monitor advised to change the battery when it detected half or less of the original capacity under fully charged condition, high internal resistance (twice the initial internal resistance at 25° C.), and high reliable temperature limit when no other problem regarding the battery is detected.

EXAMPLE 7 Testing The Presence Of Mismatched Cells

An old battery with known mismatched cells was connected to the battery status monitor and subjected to a test cycle. The monitor detected the presence of mismatched cells and displayed a warning indicating the same and advised to change the battery.

EXAMPLE 8 Test Of The Gas Saving Feature

The automotive battery in Example 1 was connected to the monitor and the starter switch in the simulation electrical circuit was switched on. The monitor determined the battery characteristics during the starting process and recharged the battery to 100% SOC. It determined the status of the battery and the power source. The monitor switched off the power source after the battery reached full charge. The battery provided all the power needs of the car. When the battery's SOC fell to 80%, the power source was switched on again. Thus the monitor controlled the battery's SOC between 80 and 100% by switching on and off the power source.

Example 9 Low Levels Of Electrolyte

A fully charged automotive battery with its electrolyte level at its "full" mark was tested with the monitor for its characteristics. A portion of the electrolyte was withdrawn from the battery until the electrolyte level was just at the top of the electrode plates. The battery was tested again with the monitor. This was repeated with the electrolyte level at ⅔, ½ and ¼ of height of the plates. The internal resistance, polarization and the reliable low temperature limit were determined in each of these tests and given in Table 2.

TABLE 2

Battery Characteristics As A Function Of Its Electrolyte Level

| Electrolyte Level | Internal Resistance | Polarization (Equation 2) | Reliable Temp limit |
|---|---|---|---|
| Full | 9.05 mOhm | 1.30 mOhm | −32.4° C. |
| Top of plate | 9.42 | 1.31 | −33.0 |

TABLE 2-continued

Battery Characteristics As A Function Of Its Electrolyte Level

| Electrolyte Level | Internal Resistance | Polarization (Equation 2) | Reliable Temp limit |
|---|---|---|---|
| ⅔th plate | 9.80 | 2.13 | −31.8 |
| ½ plate | 12.91 | 2.68 | −24 |
| ¼th plate | 24.17 | 2.94 | −5.9 |

At electrolyte levels below the top of the plates, higher values of internal resistance, polarization and reliable temperature limit were observed. Thus whenever the monitor detects large values for these parameters coupled with good state of charge and capacity, the monitor advises to add water.

EXAMPLE 10 Corroded Terminals

A fully charged automotive battery's positive terminal was coated with a thin layer of lead sulfate in dilute sulfuric acid with a brush and allowed to dry. Then it was connected as usual to the monitor and the simulation circuit shown in FIG. 3. The internal resistance, polarization and the reliable low temperature limit during the tests under good and corroded terminal conditions are shown in Table 3.

TABLE 3

Characteristics Of An Automotive Battery With Corroded Terminals

| Terminal Status | Internal Resistance | Polarization (Equation 3) | Reliable Temp Limit |
|---|---|---|---|
| Normal | 8.80 mOhm | 1.36 mOhm | −35.3° C. |
| Corroded | 16.46 | 0.48 | −18.9 |

When the monitor detected a large internal resistance, but no significant polarization, normal levels of capacity and state of charge, it advised to clean the terminal.

EXAMPLE 11 Test Of A 630 CCA Battery At Various Temperatures

A 630 CCA SLI battery of the size recommended for an Oldsmobile Firenze 2 litre engine car was attached to the battery status monitor and tested at various ambient temperatures in a Tenney environmental chamber. The acceptable IR limit corresponding to the starting power requirements of the car were calculated accordingly by the monitor. The reliable low temperature limits indicated by the monitor are shown in Table 4.

TABLE 4

Test Results Of A 630 CCA Battery Oldsmobile Firenza 2 Liter Engine

| Limit IR | Test Temperature | Predicted Temperature |
|---|---|---|
| 60 mOhm | 25 C. | −36.9 C. |
|  | 10 | −36.6 |
|  | 0 | −36.0 |
|  | −5 | −34.5 |
|  | −13 | −35.2 |
|  | −25 | −33.0 |
| 30 | −25 | −18.5 |
|  | 10 | −18.0 |
|  | 0 | −17.2 |
|  | −5 | −16.0 |
|  | −13 | −17.1 |
|  | −25 | −15.3 |

They are consistent irrespective of the battery temperature. For the purpose of testing the monitor, a second series of tests were carried out assuming the power needs of the car to be two times the normal value. (This is reflected in the acceptable limit of the IR in Table 4, i.e., half of the original value.) Again, as expected, a higher but consistent value of the reliable low temperature limit was observed for all ambient temperatures.

EXAMPLE 12 Test of A 525 CCA Battery At Various Temperatures

Similar test results with a 525 CCA battery recommended for a Cutlass Ciera 2.8 litre engine car are shown in Table 5.

TABLE 5

Test Results Of A 525 CCA Battery Cutlass CIERA - 2.8 Liter Engine

| Limit IR | Test Temperature | Predicted Temperature |
|---|---|---|
| 72 mOhm | 25 C. | −32.5 C. |
| | 10 | −32.6 |
| | 0 | −32.7 |
| | −5 | −31.4 |
| | −13 | −32.9 |
| | −25 | −30.2 |
| 36 | 25 | −13.8 |
| | 10 | −13.5 |
| | 0 | −14.2 |
| | −5 | −12.3 |
| | −13 | −14.5 |
| | −25 | −11.6 |

The monitor tested the battery characteristics as discussed before and operated successfully. The results are similar to the results of Example 11.

What is claimed is:

1. A method for monitoring a vehicle storage battery, which comprises the steps of:
   (a) measuring continuously the ambient temperature, the battery voltage, the alternator/regulator output voltage, and the current to and from said battery;
   (b) analyzing said current-voltage (I-V) data to determine the internal resistance and polarization of said battery said, internal resistance of said battery being determined from the instantaneous change in voltage at the beginning or at the end of a current input to or output from the battery which instantaneous change in voltage is caused by switching on or switching off charge pulse current to or discharge pulse current from said battery and said polarization of said battery being determined from a change in voltage during a predetermined time interval immediately following said instantaneous change;
   (c) determining the state of charge, and fault conditions, including fault conditions produced by corroded terminals, and low electrolyte level;
   (d) determining the low temperature starting limit by comparing the battery's power output capability with starting power requirements of said vehicle; and
   (e) indicating data produced by said comparison.

2. A method according to claim 1, further comprising the steps of:
   (a) determining the engine starting power requirements at various temperatures by extrapolating the power actually used by the engine at any one temperature using a predetermined mathematical function or graphical data that relates the battery's power output capability with various temperatures.

3. A method as in claim 2 wherein the engine starting power requirements are determined from the cold cranking ampere rating of said battery.

4. A method as recited by claim 2, wherein the internal resistance is determined from battery voltage and current data collected while switching on or switching off of a discharge pulse current from the battery, said discharge pulse being caused by a starter load or other accessory load.

5. A method as recited by claim 2, wherein the internal resistance is determined from battery voltage and current data collected while switching on or switching off of a charge pulse current to said battery from the alternator/regulator.

6. A method as recited by claim 2, further comprising the step of determining battery capacity measuring the charge input to the battery and the corresponding increase in the battery voltage.

7. A method as recited by claim 2, wherein the state of charge of said battery is determined from the open circuit voltage when there is no change in said open circuit voltage, and from counting the charge into and out of said battery starting from a predetermined charged state as determined from said open circuit voltage when said battery open circuit voltage is not substantially constant.

8. A method as recited by claim 2, wherein the internal resistance of the battery is determined by dividing the difference between the last battery voltage reading when the engine is in an off condition and the first battery voltage reading during engine starting condition by the current passing out of said battery during said starting condition.

9. A method as recited by claim 2, wherein the polarization of said battery is determined by dividing the difference between the first battery voltage reading and the battery voltage reading after a preset interval of time during engine starting condition by the current passing out of said battery during said starting condition.

10. A method as recited by claim 2, wherein a low electrolyte level and a need for addition of water are indicated when said polarization and internal resistance are larger than a predetermined levels and said state of charge and capacity are above preset levels.

11. A method as recited by claim 2, wherein corroded terminals and a need for cleaning terminals are indicated when state of charge and capacity of said battery are above preset levels, the internal resistance is higher than a preset limit and said polarization is below a preset limit.

12. A method as recited by claim 2, wherein end of useful life of said battery and a need to change it are indicated, upon detection of (i) one or more soft-shorted cells or (ii) internal resistance higher than a preset limit, together with normal polarization and state of charge higher than a preset limit.

13. A method as recited by claim 2, wherein presence of a soft shorted cell is detected by decrease of said battery's open circuit voltage to a stable value lower than a preset level.

14. A method as recited by claim 2, further comprising the step of switching the alternator/regulator on and off to keep the battery's state of charge within a preset limit.

15. A method as recited by claim 2, further comprising the steps of:

(a) subjecting said battery to a special test cycle wherein a predetermined profile of current or voltage is imposed onto the battery by the charging system and the battery response voltage or current is measured;

(b) evaluating the data in the forms, dV/dI versus I, or dI/dV versus V;

(c) determining the battery characteristics, including the capacity, and the voltage;

(d) determining the battery defects, including mismatched cell, soft-shorted cell, and loss of capacity; and (e) indicating said data and advice.

16. A method as recited by claim 15, wherein the end of useful life of said battery is indicated by the presence of mismatched cells or soft-shorted cells.

17. A method for monitoring a vehicle storage battery, which comprises the steps of:

(a) measuring continuously the ambient temperature, the battery voltage, the alternator/regulator output voltage, and the current to and from said battery;

(b) analysing said current-voltage (I-V) data to determine the internal resistance and polarization of said battery, and to determine therefrom battery life and fault conditions produced from corroded terminals and low electrolyte level;

(c) determining the state of charge, and fault conditions by:

(i) subjecting said battery to a special test cycle wherein a predetermined profile of current or voltage having increasing applied current or voltage (ramp up) and decreasing applied current or voltage (ramp down) directions is imposed onto the battery by the charging system and the battery response voltage or current is measured, the state of charge being determined from the current at which gas inside said battery stops evolving in the ramp down direction;

(ii) evaluating the data in the forms, dV/dI versus I, or dI/dV versus V;

(iii) determining the battery characteristics, including the capacity, and the voltage;

(iv) determining the battery defects, including mismatched cell, soft-shorted cell, and loss of capacity; and (v) indicating said data and advice;

(d) determining the low temperature starting limit by comparing the battery's power output capability with starting power requirements of said vehicle, the determination of engine starting power requirements being made at various temperatures by extrapolating the power actually used by the engine at any one temperature using a predetermined mathematical function or graphical data that relates the battery's power output capability with various temperatures; and (e) indicating data produced by said comparison.

18. A method for monitoring a vehicle storage battery, which comprises the steps of:

(a) measuring continuously the ambient temperature, the battery voltage, the alternator/regulator output voltage, and the current to and from said battery;

(b) analysing said current-voltage (I-V) data to determine the internal resistance and polarization of said battery and to determine therefrom battery life and fault conditions produced from corroded terminals and low electrolyte level;

(c) determining the state of charge, and fault conditions by:

(i) subjecting said battery to a special test cycle wherein a predetermined profile of current or voltage having increasing applied current or voltage (ramp up) and decreasing applied current or voltage (ramp down) directions is imposed onto the battery by the charging system and the battery response voltage or current is measured;

(ii) evaluating the data in the forms, dV/dI versus I, or dI/dV versus V;

(iii) determining the battery characteristics, including the capacity, and the voltage, said battery capacity being determined from the current at which said battery starts evolving gas in said battery in the ramp up direction;

(iv) determining the battery defects, including mismatched cell, soft-shorted cell, and loss of capacity; and (v) indicating said data and advice;

(d) determining the low temperature starting limit by comparing the battery's power output capability with starting power requirements of said vehicle, the determination of engine starting power requirements being made at various temperatures by extrapolating the power actually used by the engine at any one temperature using a predetermined mathematical function or graphical data that relates the battery's power output capability with various temperatures; and (e) indicating data produced by said comparison.

* * * * *